United States Patent [19]

Schrenk

[11] Patent Number: 4,819,204

[45] Date of Patent: Apr. 4, 1989

[54] METHOD FOR CONTROLLING MEMORY ACCESS ON A CHIP CARD AND APPARATUS FOR CARRYING OUT THE METHOD

[75] Inventor: Hartmut Schrenk, Haar, Fed. Rep. of Germany

[73] Assignee: Siemens Aktiengesellschaft, Berlin and Munich, Fed. Rep. of Germany

[21] Appl. No.: 882,222

[22] Filed: Jul. 7, 1986

[30] Foreign Application Priority Data

Jul. 8, 1985 [DE] Fed. Rep. of Germany ....... 3524371

[51] Int. Cl.[4] ...................... G06F 11/34; G11C 11/40; G06K 5/00

[52] U.S. Cl. .................................... 364/900; 365/218; 235/380; 235/487

[58] Field of Search ... 364/900 MS File, 200 MS File; 235/380; 365/218, 230, 488, 487

[56] References Cited

U.S. PATENT DOCUMENTS 4,105,156 8/1978 Dethloff .
4,204,113 5/1980 Giraud et al. .
4,211,919 7/1980 Ugon .................................. 235/488
4,572,946 2/1986 Schrenk .............................. 235/380
4,648,076 3/1987 Schrenk .............................. 365/230
4,680,736 7/1987 Schrenk .............................. 365/218
4,712,177 12/1987 Schrenk .............................. 235/380
4,746,788 5/1988 Kawana .............................. 235/492
4,749,982 6/1988 Rikuna et al. ....................... 235/380

FOREIGN PATENT DOCUMENTS 0128362 12/1984 Fed. Rep. of Germany .

OTHER PUBLICATIONS

Betriebspraxis, vol. 31, Issue Feb. 1982, pp. 48–53, "The Chip Card Next Generation of Automation Card".

*Primary Examiner*—Gareth D. Shaw
*Assistant Examiner*—Viet O. Nguyen
*Attorney, Agent, or Firm*—Herbert L. Lerner; Laurence A. Greenberg

[57] ABSTRACT

A method for controlling memory access to a user area and an initial code area of a main memory of a chip card includes carrying out an internal release procedure with a data comparison of an initial code from the initial code area and a data word from a terminal; firmly coupling addresses of the main memory and of a control memory to each other; marking several storage locations of the main memory as the initial code area with one control bit at a time in the control memory; marking a first code deposited in the associated storage location of the first code area as activated or deactivated with one further control bit at a time in the control memory; generating an initial release signal in a release procedure only if a storage location is addressed by an activated initial code and if agreement with the data word entered by the terminal prevails; and preventing generation of the initial release signal if a deactivated code word is addressed and/or if the respective first code does not agree with the data word, and an apparatus for carrying out the method.

8 Claims, 1 Drawing Sheet

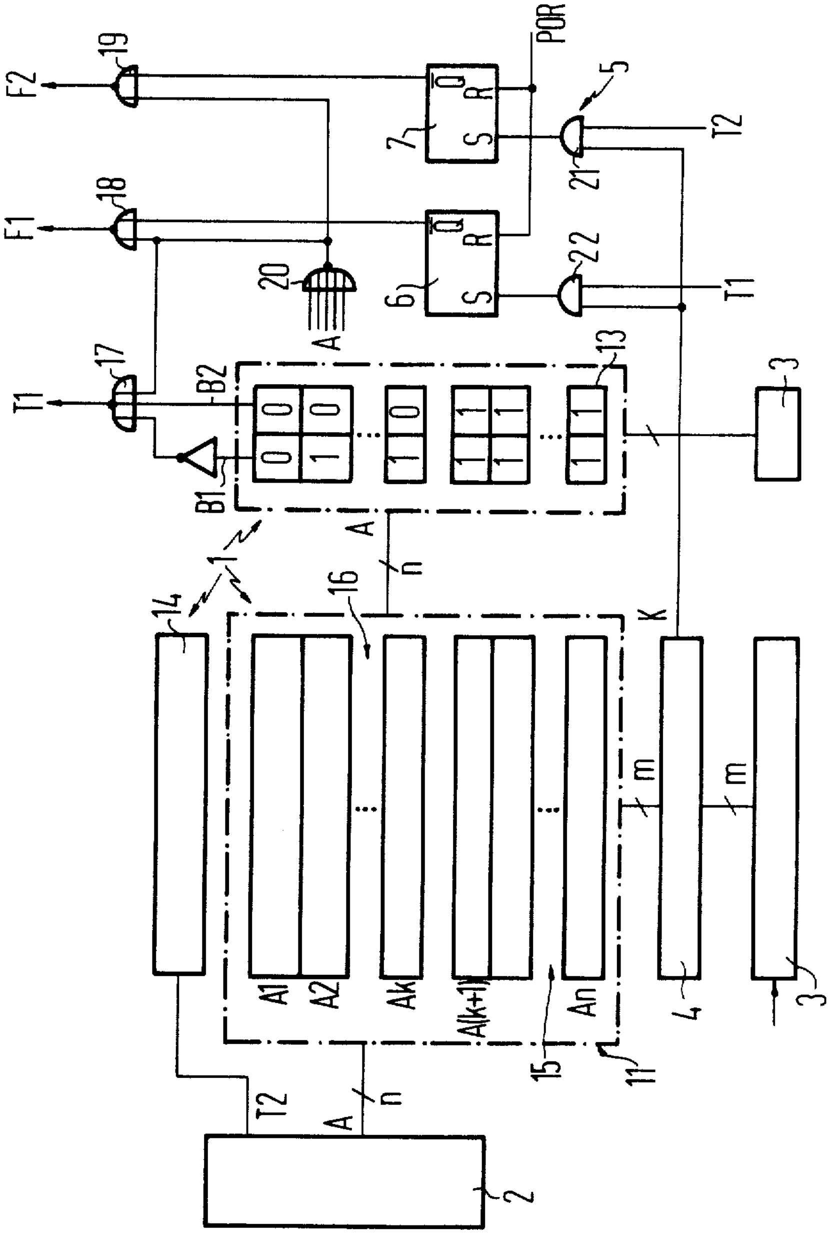
F2
19
F1
18
20
A
7
S
R
Q̄
6
S
R
Q̄
POR
5
21
22
T2
T1
T1
17
B2
B1
13
3
1
A
n
16
14
K
A1
A2
Ak
A(k+1)
An
m
m
4
3
15
11
T2
A
n
2

METHOD FOR CONTROLLING MEMORY ACCESS ON A CHIP CARD AND APPARATUS FOR CARRYING OUT THE METHOD

BACKGROUND OF THE INVENTION AND PRIOR ART

The invention relates to a method for controlling memory access on a chip card and an apparatus for carrying out the method.

Data-controlled payment systems are used in order to pay for merchandise without cash or for settling payment for services or the like. Such data-controlled payment systems are described, for instance, in the journal "Betriebspraxis" B.B1.2/1982, page 48, by Dr. R. Nowak and W. Roeder, in an article entitled "Die Chipkarte—nächste Generation der Automatenkarte". The cards used in such devices have an essential element which is a non-volatile electric data memory that can be accessed through electric contacts on the surface of the card. During every use, the memory content is accessed by an arithmetic unit and may be changed in the process.

Such cards are used in security and access systems, in bookkeeping or recording systems and in debit or credit systems. In order to assure a wide circulation and frequent use of the cards, operators of such systems issue large numbers of cards and offer a sprawling network of readers and computers. However, in order to preclude misuse of the data, the card systems must meet stringent security requirements. The spread of the carrier cards cannot always be controlled and therefore must be especially protected against use by unauthorized persons.

This can be achieved by a release operation, in which a data comparison between a PIN code word which refers to one person is entered by an operator or encoded by a computer and a stored reference word is carried out. In a further check, the card is identified within a terminal by means of a card-related code which is stored on the card and in the terminal. In this manner, the use of a given card in one or more given terminals is checked for authorization. Depending on the result of the comparison, access is either released (i.e. approved) or prevented (i.e. denied). If a card-related secret code is identically stored in a larger number of cards and terminals, there is the risk of this secret code also becoming known to an unauthorized person who could therefore install valid cards or terminals himself without authorization.

Protection provided by a card-related code therefore fails if the data become known, such as through betrayal. One protection against this is to limit the validity period of circulating cards. However, this limitation requires the regular issuance of new cards and therefore can only be carried out at high cost and inconvenience.

SUMMARY OF THE INVENTION

It is accordingly an object of the invention to provide a method for controlling memory access on a chip card and an apparatus for carrying out the method, which overcomes the herein-afore-mentioned disadvantages of the heretofore-known methods and devices of this general type, which protects against abuse of the card-related secret data used for identification or authentication and which allows the validity period of the secret code to be limited without reducing the circulation of the cards.

With the foregoing and objects in view there is provided, in accordance with the invention, a method for controlling memory access to a user area and a first code area of a main memory of a chip card, which comprises:

carrying ou an internal release procedure with a data comparison of an initial code from first code area and a data word from a terminal;

permanently associating addresses of the main memory with those of a control memory;

marking several storage locations of the main memory as the first code area with one control bit at a time in the control memory;

marking a first code deposited in the associated storage location of the first code area as activated or deactivated with one further control bit at a time in the control memory;

generating an initial release signal in a release procedure only if a storage location is addressed by an activated initial or first code and if agreement with the data word entered by the terminal prevails; and preventing generation of the initial release signal if a deactivated code word is addressed and/or if the respective first code does not agree with the data word.

In accordance with another mode of the invention, there is provided a method, which comprises generating a second release signal only if a second code deposited in a second code area is addressed and if agreement of the second code with an externally entered and if agreement of the second code with an externally entered data word is provided; and programming the control memory at least for a partial change of the user area into the initial code area only after the second release signal is generated.

In accordance with an additional mode of the invention, there is provided a method, which comprises deactivating, blocking or erasing activated first code data without using the second code data.

In accordance with an added mode of the invention, there is provided a method, which comprises writing at least one second bit into the control memory for deactivating the second code data.

In accordance with a further mode of the invention, there is provided a method, which comprises erasing an address-wise coupled memory location in the initial code area and in the control memory together.

In accordance with again another mode of the invention, there is provided a method, which comprises erasing the bits written into the control memory together with the initial code data which have been invalid, for reactivating a storage location of the initial code area as the user area.

In order to carry out the method, there is provided an apparatus for controlling memory access, comprising a main memory of a chip card including a user area and an initial or first code area having a plurality of storage locations for receiving a plurality of initial code data, a control memory connected to the main memory having the addresses of the storage locations located at the storage locations of the initial code area and having a content characterizing (i.e. "marking") the initial code data in the initial code area of the main memory as being either activated or deactivated, a release logic being connected to the main memory and having an output side, and means for issuing a release signal at the output side of the release logic at least only when the initial code data in the initial code area are marked as being activated by the content of the control memory and if a comparison between the initial code data and an externally given data word is successful (i.e. affirmative).

In accordance with a concomitant feature of the invention, there is provided a second code region or area connected to the main memory and independent of the user and initial code areas for receiving second code data, and means for issuing another release signal at the output side of the release logic for programming access to the control memory only after an affirmative comparison between the second code data and an externally entered data word.

The invention is based on the fact that the card chip contains a logic and a control memory which permits a change of the card-related secret data used for the identification or authentication in the chip, which are designated below as the first code. To this end, several of these first codes are programmed (i.e. stored) in a main memory on the chip. The activation of an address of the main memory in order to program a first code is protected by a second code. If this second secret code is activated, the address of the main memory in question must be automatically blocked from being read out and instead, action on a comparator logic must be released. The second code is to be kept as a system secret and is to be applied neither on the card nor in a terminal nor by the card holder, but only in the environment of a central location that is well protected against fraud.

When applied in a chip card system, several first codes are preprogrammed as a precautionary measure when issuing the chip cards, using the second code. Access is thereof selectably fixed in the terminal and access is only provided to a single first code, when a card is used. The remaining first codes, which are prepared as a precautionary measure, are not subject to the risk or fraud as long as they are not used in the terminal. If the validity of a code has expired, the current first code can easily be replaced in the terminals themselves. The number of these terminals is relatively small in practice. After changing to a different first code, a first code which has become invalid can be blocked by writing in the control memory or merely by erasing in all circulating chip cards when they are used in any desired terminal. This reduces the risk of holders of chip cards suffering damage due to expired and therefore no longer secret first code words due to terminals being manipulated without authorization.

Other features which are considered as characteristic for the invention are set forth in the appended claims.

Although the invention is illustrated and described herein as embodied in a method for controlling memory access on a chip card and an apparatus for carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the single figure of the drawing which is a schematic circuit diagram of a memory configuration with a logic unit for protecting the access.

BRIEF DESCRIPTION OF THE DRAWING

The single FIGURE of the drawing is a block diagram showing the major building blocks of the invention.

DESCRIPTION OF THE PREFERRED EMBODIMENTS

Referring now to the FIGURE of the drawing in detail, there is seen an apparatus including a memory configuration 1, a line decoder 2, a comparator 4, a data register 3 and a release logic unit 5. The memory configuration 1 is formed of a main memory 11 with a multiplicity of n storage locations addressable word by word, a control memory 13 having storage locations which have their addresses stored in the storage locations of the main memory 11 and can be addressed together by them through n address lines A, as well as a further independent area in the form of a second code area or region 14. The main memory 11 is divided into a user area 15 and a first or initial code area 16, as a function of the programming state of the control memory 13. In the illustrated embodiment, the first code area 16 has storage locations with addresses A1, A2 to AK. The addresses of the user memory 15 read A(K+1) to An. The data register 3 for entering and reading out data into and out of the memory configuration is laid out for the word length of the main memory 11 and the first control memory 13. With a word length of m bits for the main memory 11 and two bits for the control memory 13, the data register 3 must therefore accept m +2 bits. The data comparator 4 which is m bits wide is connected between the data register 3 and the common input/output of the main memory 11 for comparing a memory content with a register content.

In the illustrated embodiment, the control logic 5 is formed of two flip-flops 6 and 7 as well as AND gates 21, 22 and NOR gates 17 through 20. The logic unit 5 generates an initial release signal F1 which controls the write, read and clearing access to the main memory 11. Another rlease signal F2 controls the writing of a control bit B2 in the control memory 13.

The operation of the entire apparatus will be described with the aid of examples. To this end, it is assumed that a first code is stored in the first storage location (address A1) of the first code area 16, which is already deactivated. The second storage location (address A2) contains a first code which is currently used for the user memory accesses. In the remaining storage locations (address AK), other first codes are deposited as a precautionary measure, which are not yet needed during the current memory accesses but are available in the event of deactivation of the code in the second storage location. The number of such first codes deposited as a precautionary measure depends on how often a code change can be expected.

The control member 13 preferably includes two bit locations with respective control bits B1 and B2, per memory address Al to An.

The bit locations determined whether the corresponding storage locations in the main memory 11 serve as the user memory 15 (B1=1 and B2=1) or as the first code memory 16 (B2=0) or whether a valid first code (B1=1) or a deactivated first code (B1=0) is involved.

Assuming that a data word which is m bits wide and is transferred to the terminal and deposited in the data register 3 authorizes access to the user memory 15, a comparator signal K will be a logical 1 after a comparison with the current first code stored at the address A2. As a further condition for access to the user memory 15, it is required that a current first code as well as the main memory 11 and not the independent area 14 is utilized for obtaining the release signal. This requirement is checked and confirmed on one hand by means of the control bits B1, B2 through a NOR gate 17 and on the other hand through the address lines A at a NOR gate 20 and then through the NOR gate 17. If all of these requirements are met, a control signal T1 is presented as a logical 1 and the release flip-flop 6 is set at its setting input S through AND gate 22. A Q output of the release flip-flop 6 is connected to the output of the NOR gate 17 through a NOR gate 18 and the release signal F1 assumes a logical 1 level.

If the release flip-flop 6 is set, it is possible to read or to otherwise use the user memory 15.

However, if at least one of the above-described conditions is not met during the checking of the data word given by the user, the release signal F1 is not generated and access to the user memory 15 is not released.

The activation of a memory area as the storage location for a first code is accomplished by using the first code and writing one or more bits into the control memory 13. In the example being discussed, this is the control bit B2. Accompanying the activation as a code word, is a blocking of read-out, a release for comparison operations and a protection against changes by writing or erasing. It is possible to block a valid first code without the use of the second code. For this purpose, the control bit B1 in the example given assumes the state logical 0.

In the case of a memory 1 of the $E^2$PROM type, the deactivation can also take place directly by erasing the control bit B2 in the control memory 13, together with the first code word which has become invalid. In this case, clearing must be possible without using the second code, while the erasing can also be made dependent on the use of the second code when blocking by the control bit B1.

A control memory 13 written with a first code is only cleared together with the corresponding first code which has become invalid. This prevents unauthorized deactivation of preprogrammed first code words from making them readable.

Writing into the control memory 13 and particularly writing of the control bit B2 for changing a user memory 15 into a first code memory 16, assumes the activation of the second release signal F2. After a positive comparision of an externally entered data word with the second code word from the second code memory 14 in the comparator 4, the second release flip-flop 7 is set if the second code area 14 is activated through its address T2. When the apparatus is switched on, the two release flip-flops 6, 7 are reset at resetting inputs R by a reset signal POR.

In conclusion, the essential features of the illustrated embodiment will be listed once more. Depending on the programming state of the control memory 13, the main memory 11 is either a user memory 15 or a first code area 16. In the first case, the control bit B2 is made B2=1. In the second case, the control bit B2 is made =0 by writing by means of the code in the second code area 14. Deactivated first codes are characterized by the control bit B1=0 and are only changed back onto a user region by erasing. A memory release achieved by the first code always relates to that part of the main memory which still acts as a user area because the control bit is B1=1. For the first code area 16 (control bit B2=0), reading-out or altering is not possible without the second code, with the exception of a complete erasure together with the control bit B2.

The foregoing is a description corresponding in substance to German Application P No. 35 24 371.6, dated July 8, 1985, the International priority of which is being claimed for the instant application, and which is hereby made part of this application. Any material discrepancies between the foregoing specification and the aforementioned corresponding German application are to be resolved in favor of the latter.

I claim:

1. Method for controlling memory access from a user terminal to a user area and a first code area of a main memory of a chip card, the method which comprises the steps of:
- executing a comparison first code stored in said first code area and a data word from the user terminal by the use of a comparator;
- fixedly associating addresses of said first code area in main memory with respective addresses of a control memory;
- marking several storage locations of the main memory as the first code area with respective first control bits from said control memory;
- marking with respective second control bits, having complementary logic states, from said control memory, a first code stored in the associated storage location of the first code area as being one of (a) activated and (b) deactivated first code according to the logic state of said second control bits;
- generating an initial release signal in an internal release procedure if a storage location is addressed by an activated first code and if the comparison with the data word entered by the user terminal is affirmative; and preventing generation of the initial release signal if at least one of (a) a deactivated code word is addressed and (b) the comparison of the respective first code with the data word is not affirmative.

2. Method according to claim 1 including a second code stored in a second code area, which comprises the steps of generating a second release signal only if the second code stored in said second code area is addressed and if a comparison of the second code with an externally entered data word is affirmative; and programming the control memory to change at least a part of the user area into the first code area only after the second release signal is generated.

3. Method according to claim 2, which comprises at least one of the steps: deactivating, blocking and erasing activated first code data without using the second code data.

4. Method according to claim 2, which comprises the step of: writing at least one second bit into the control memory for deactivating the second code data.

5. Method according to claim 1, which comprises the step of: erasing one of said memory addresses of the first code area and the permanently associated address of the control memory.

6. Method according to claim 1, which comprises the step of: erasing the bits written into the control memory together with the first code data which have become invalid, for reactivating a storage location of the first code area as a storage location in the user area.

7. Apparatus for controlling memory access, comprising a main memory of a chip card including a user area and a first code area having a plurality of storage locations for receiving a plurality of first code data, a control memory connected to said main memory having storage locations fixedly associated with respective addresses of said storage locations of said first code area and having a content for marking said first code data in said first code area of said main memory as being activated or deactivated, a release logic being connected to said main memory having an output, and means for issuing a release signal at said output of said release logic at least only when said first code data in said first code area are marked as being activated by the content of said control memory and if a comparison between said first code data and an externally given data word is affirmative.

8. Apparatus according to claim 7, including a second code area connected to said main memory being independent of said user and first code areas for receiving second code data, and means for issuing another release signal at said output of said release logic for programming access to said control memory only after an affirmative comparison between the second code data and an externally entered data word.

* * * * *